(12) United States Patent
Mörsberger (10) Patent No.: US 6,560,746 B1
(45) Date of Patent: May 6, 2003

(54) PARALLEL CRC GENERATION CIRCUIT FOR GENERATING A CRC CODE

(75) Inventor: Gerd Mörsberger, Bubenreuth (DE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/382,591

(22) Filed: Aug. 25, 1999

(30) Foreign Application Priority Data

Aug. 26, 1998 (DE) .......................................... 198 38 865

(51) Int. Cl.[7] .............................................. H03M 13/00
(52) U.S. Cl. ........................ 714/781; 714/757; 714/758
(58) Field of Search ................................. 714/757, 758, 714/781

(56) References Cited

U.S. PATENT DOCUMENTS

| | | | | |
|---|---|---|---|---|
| 4,593,393 | A | 6/1986 | Mead et al. ................. | 714/757 |
| 5,103,451 | A | 4/1992 | Fossey ........................ | 714/757 |
| 5,282,214 | A | * 1/1994 | Dravida ...................... | 714/757 |
| 5,878,057 | A | * 3/1999 | Maa ............................ | 714/757 |

FOREIGN PATENT DOCUMENTS

| | | |
|---|---|---|
| EP | 0 431 416 A1 | 6/1991 |
| JP | 2-101824 A | 4/1990 |

OTHER PUBLICATIONS

*High Speed Parallel CRC Circuits in VLSI*; Tong–Bi Pei et al.; IEEE Transactions on Communications, vol. 40; pp. 653–657; Apr. 4, 1992.

*Parallel CRC Generation*; Guido Albertengo et al.; IEEE Micro; pp. 63–71; Oct. 1990.

\* cited by examiner

Primary Examiner—Emmanuel L. Moise (57) ABSTRACT

The invention relates to a parallel CRC generation circuit comprising an input register means (I), an output register means (C), a number of XOR gates ($XOR_1$–$XOR_N$) and a coupling means (CM) that feeds predetermined ones of the output lines ($C_0$–$C_{N-1}$) of the output register means (C) and output lines ($I_1$–$I_n$) of the input register means (I) as inputs to the respective XOR gates. According to the invention a matrix representation of the state change based on the selected CRC polynomial is set up and evaluated, such that the coupling means (CM) only uses the minimum number of feedbacks of the output lines and feed-forwards of the output lines of the input register means (I). Thus, the parallel CRC calculation circuit according to the invention has no redundancy and uses only a minimum hardware amount.

3 Claims, 8 Drawing Sheets

FIG.1a
PRIOR ART $CRC = a_N x^N + a_{N-1} x^{N-1} + \ldots + a_n x^n + \ldots + a_1 x^1 + a_0 x^0$ FIG.1b
PRIOR ART

FIG.2c $$CRC13 = X^{13} + X^{12} + X^7 + X^6 + X^5 + X^4 + X^2 + 1$$

|  |  | INPUT BITS | CONTENT OF REGISTERS |
|---|---|---|---|
|  |  | $I_7\ I_6\ I_5\ I_4\ I_3\ I_2\ I_1\ I_0$ | $C_{12}(0)\ C_{11}(0)\ C_{10}(0)\ C_9(0)\ C_8(0)\ C_7(0)\ C_6(0)\ C_5(0)\ C_4(0)\ C_3(0)\ C_2(0)\ C_1(0)\ C_0(0)$ |
| $g_0$ : | $C0(8) =$ | X X X X X | X X X X X |
| $g_1$ : | $C1(8) =$ | X X X X X | X X X X X |
| $g_2$ : | $C2(8) =$ | X X     X X | X X         X X |
| $g_3$ : | $C3(8) =$ |   X X       X | X           X X |
| $g_4$ : | $CA(8) =$ | X X   X X | X X     X X |
| $g_5$ : | $C5(8) =$ | X     X X   X | X   X X       X |
| $g_6$ : | $C6(8) =$ | X   X X     X | X       X X   X |
| $g_7$ : | $C7(8) =$ | X   X     X |   X     X     X |
| $g_8$ : | $C8(8) =$ |   X   X   X | X     X   X         X |
| $g_9$ : | $C9(8) =$ |     X   X   X | X     X   X           X |
| $g_{10}$: | $C10(8) =$ |     X   X | X     X           X |
| $g_{11}$: | $C11(8) =$ |       X   X | X   X             X |
| $g_{12}$: | $C12(8) =$ | X X X X   X | X       X X X X X |

COUPLING GROUPS $g_0 \cdots g_{12}$ for Fig. 2b

PARALLEL CRC GENERATION CIRCUIT FOR GENERATING A CRC CODE

FIELD OF THE INVENTION

This application claims priority under 35 U.S.C. §§119 and/or 365 to 198 38 865.9 filed in Federal Republic of Germany on Aug. 26, 1998; the entire content of which is hereby incorporated by reference.

The invention generally relates to the generation of a CRC (cyclic redundancy check) which is used for checking errors when transmitting digital data from a transmitter to a receiver. The CRC may have a different length and is added to the user data in the transmitter. In the receiver the CRC data is compared with the CRC data re-generated on the basis of the received user data. If the two generated CRCs match, then it is determined that no serious transmission errors have occurred during the transmission between transmitter and receiver.

The generation of a CRC code is a standard technique and circuits are known in the prior art for generating this CRC code either serially or parallely. As will be explained below with more detail, design tools are available for designing such serial and parallel generation circuits. However, so far it was not known that such design tools for the parallel CRC generation circuit did not take into account redundancies in the feedback lines. That is, if more feedback lines are used than absolutely necessary to perform the parallel CRC generation, then the hardware amount is extensive and the speed of parallely generating the CRC bits is decreased.

The present invention particularly relates to the problem of how the redundancies in the parallel CRC generation circuits can be reduced.

BACKGROUND OF THE INVENTION

When designing a CRC generation circuit for generating a CRC code of length N, a CRC polynomial CRCN is used, which is generally defined by the following equation (1a):

$$CRCN = a_N x^N + a_{N-1} x^{N-1} + \ldots + a_n x^n + \ldots + a_1 x^1 + a_0 x^0 \tag{1a}$$

Figure 1A:
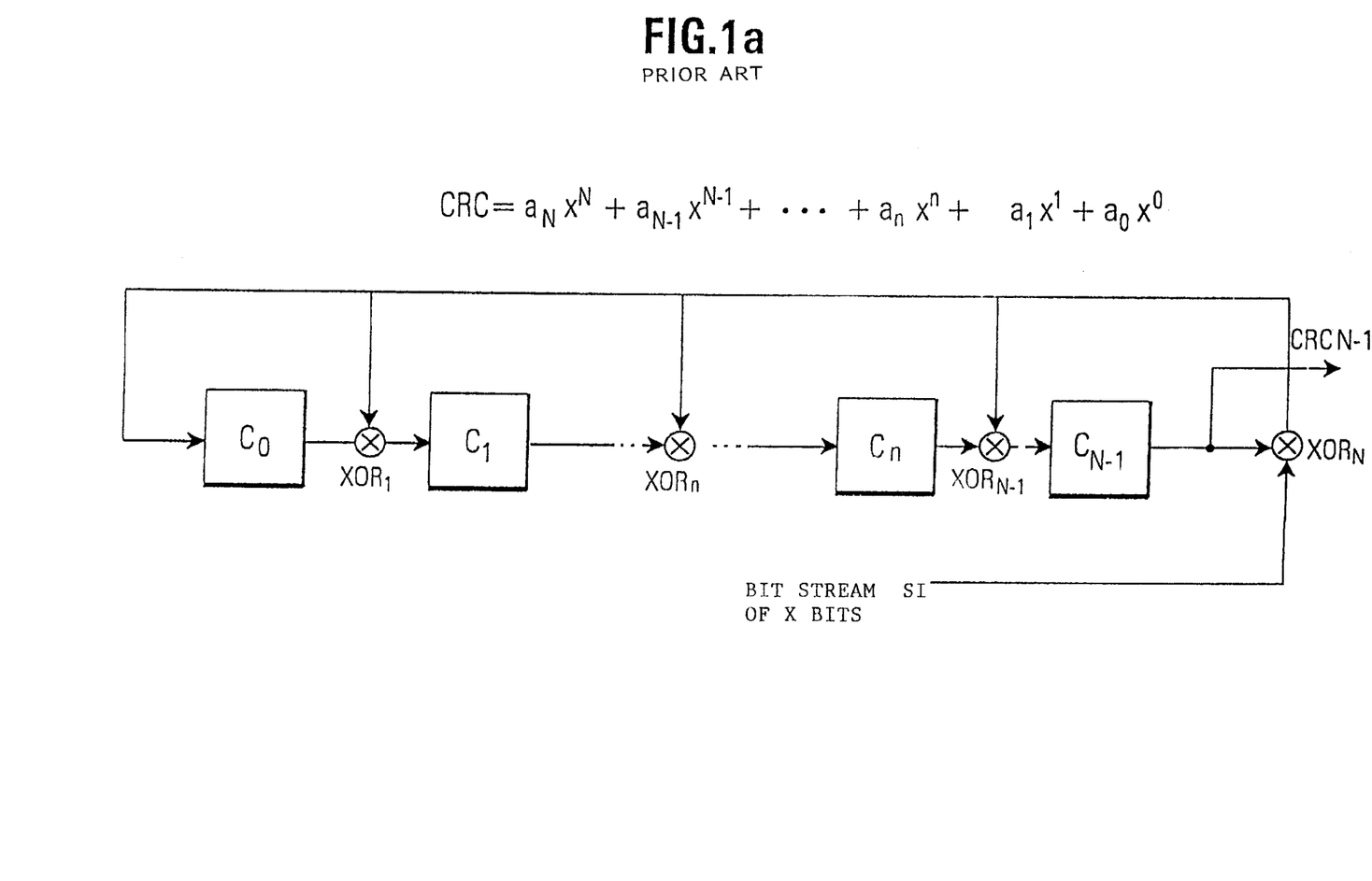
FIG. 1a shows a conventional serial CRC generation circuit for a general CRC polynomial.

In this equation (1a) the coefficient $a_N=1$, $a_0=1$ and the coefficients $a_n$, $n=1, \ldots, N-1$ are 0 or 1 depending on the CRC code to be formed. FIG. 1a shows the principle of a serial CRC generation circuit realized on the basis of the CRC polynomial in equation (1a). The CRC generation circuit comprises a number N of shift registers $C_0, C_1, \ldots, C_n, \ldots, C_{N-1}$ in series connection. There are also provided a number N of XOR gates $XOR_1 \ldots XOR_n, \ldots, XOR_{N-1}, XOR_N$. A bit stream SI is input serially to the XOR gate $XOR_N$. Essentially, depending on the selection of N and $a_n$ in equation (1a), XOR gates are provided between each two shift registers $C_n, C_{n-1}$. Depending on the feedbacks from the XOR gate $XOR_N$ to the individual shift registers (flip-flops) C, a desired CRC code is output from the shift register $C_{N-1}$ of the final stage.

Thus, the designer selects the CRC code to be generated by selecting the feedbacks, i.e. by selecting N and which of the coefficients $a_n$ are 0 or 1 depending on the desired CRC code. In the circuit in FIG. 1a this selection of coefficients $a_n$ is reflected by the feedback and the insertion of the particular XOR gates between respective two shift registers.

The operation of the circuit in FIG. 1a is as follows. The input bit stream SI of X bits (is for example 100) is serially input to the XOR gate $XOR_N$ at sequential clock cycles. Thereafter the CRC code stored in the serial shift registers is serially read out. This means, that after using X clocks cycles to clock the X bits into the CRC circuit, another N clock cycles must be used to serially read out the generated CRC code. The read out CRC code is then serially appended to the user data of X bits to be transmitted together with the user data to the receiver.

Therefore, using the serial CRC generation circuit of FIG. 1a, an additional N clock cylces are always needed to read out the generated CRC code, which increases the processing time for generating and transmitting the CRC code.

Figure 1B:
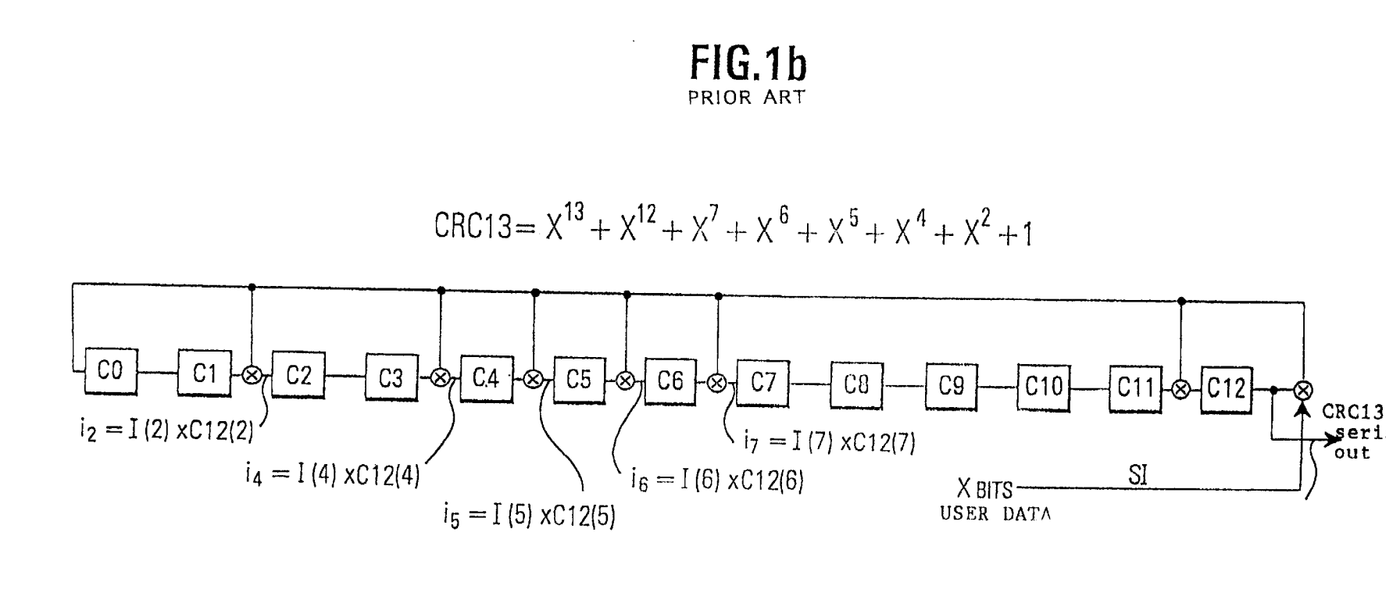
FIG. 1b shows an example of a conventional serial CRC generation circuit for generating a selected CRC code of length 13.

FIG. 1b shows an example of the serial CRC circuit for a special CRC 13 code. That is, in FIG. 1b the polynomial is chosen as:

$$CRC13 = X^{13} + X^{12} + X^7 + X^6 + X^5 + X^4 + X^2 + 1 \tag{1b}$$

as shown in FIG. 1b above the serial CRC circuit. Thus, in the circuit of FIG. 1b, N=13 and $a_{13}=a_{12}=a_7=a_6=a_5=a_4=a_2=a_0=1$. The selection of these coefficients in the CRC polynomial is reflected in the circuit configuration by the feedbacks from the shift register $C_{12}$ to the other shift registers $C_0-C_{11}$ via the respective XOR gates between the individual shift register C. In FIG. 1b the CRC having length 13 is output serially at the "CRC 13 serial out" after the X bits have been serially input.

Figure 1C:
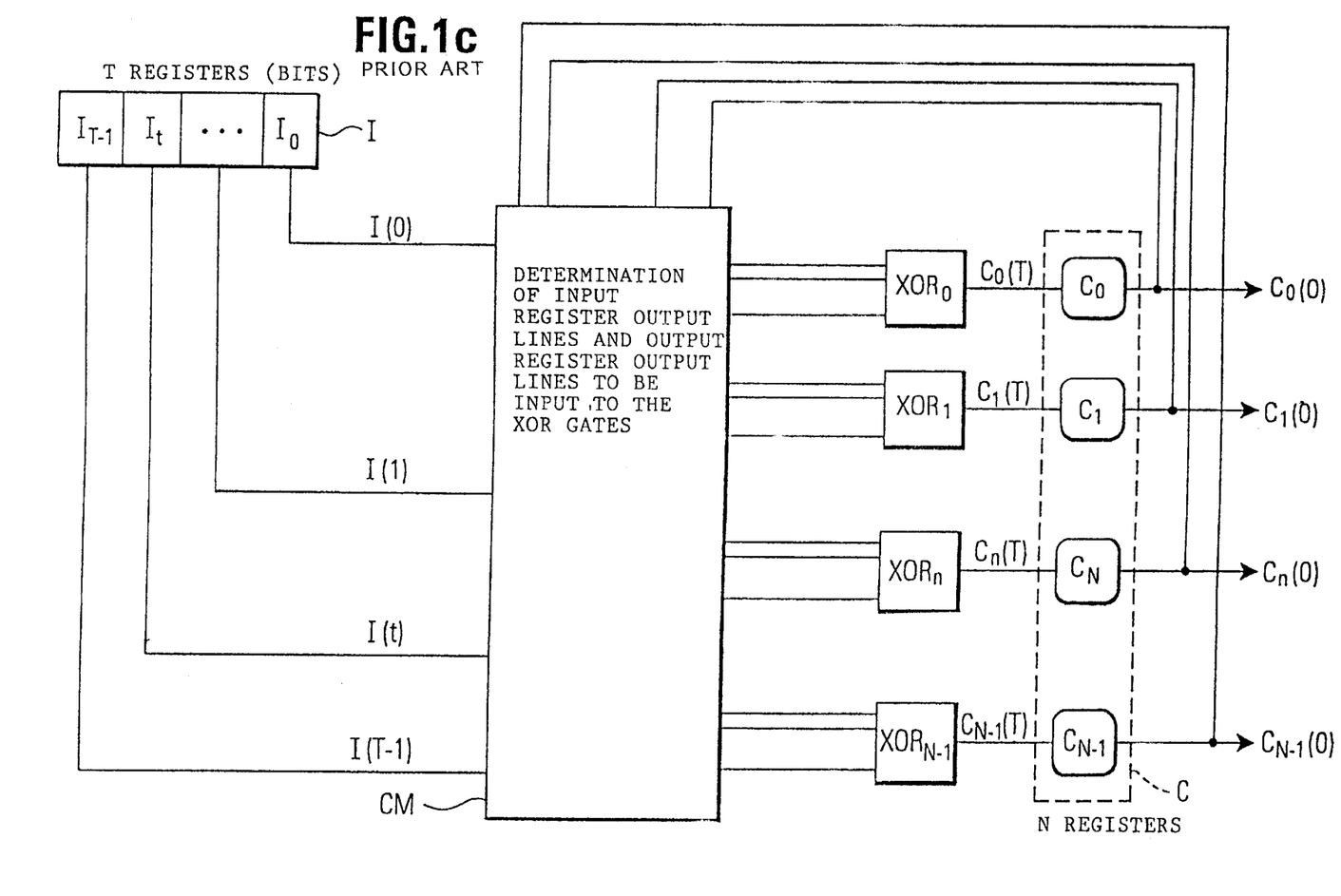
FIG. 1c shows the general configuration of a parallel CRC generation cirucit using a coupling means CM according to the prior art.

Since in the circuits in FIG. 1a and FIG. 1b the processing is performed serially, the processing time is increased. Therefore an alternative solution is to perform the generation of the CRC code parallely for a data packet of T bits which is a parallel part of the X serial bits. FIG. 1c shows a general configuration of a parallel CRC generation circuit.

In FIG. 1c an input register means I having T input registers $I_0, I_1, \ldots I_t \ldots I_{T-1}$ for simultaneously storing T input bits is provided. Each input register has an output line $I(0), I(1), \ldots I(t) \ldots I(T-1)$ which leads to a coupling means CM. An output register means C has N output registers $C_0, C_1, \ldots C_n \ldots, C_{N-1}$ for parallely storing the generated CRC code. Each of the output registers has an input line $C_0(T), C_1(T), \ldots, C_n(T) \ldots C_{N-1}(T)$ and an output line $C_0(0), C_1(0) \ldots C_n(0) \ldots C_{N-1}(0)$. Furthermore, there are provided a number N of parallel XOR gates $XOR_0, XOR_1 \ldots XOR_n \ldots XOR_{N-1}$ each having an output connected to a respective input line of the output registers and a number of input lines coupled to the coupling means CM. The output lines of the respective output registers are also input to the coupling means CM.

The operation of the parallel CRC generation circuit in FIG. 1c is as follows. From the data stream of X bits, a number of T bits are input (parallely) to the input register means I. The coupling means CM determines which of the outputs lines from the input register means I and which of the output lines from the output registers C are input to the respective XOR gates. The coupling means does not "couple" the outputs from the input registers and the outputs of the output registers but merely determines which of the input lines of the XOR gates must receive a separate input from the respective input and output registers. In one clock cylce the output registers C contain a parallely generated CRC code. Then, in the next clock cycle the next set of T input bits are input to the input register means I. Then they are input to the XOR gates in combination with the previous CRC code held in the output registers C. Thus, for every T input bits only one clock cycle is needed to parallely generate the CRC code. By contrast to the serial circuits in FIG. 1a and FIG. 1b, where the serial generation of the CRC code takes a large amount of time and is therefore undesirable, the parallel generation circuit of FIG. 1c builds the CRC value for the number T of input bits in one clock cycle.

However, generally the design of the coupling means CM which determines which of the output lines of the input register and output lines of the output registers need to be supplied as inputs to the respective XOR gates is not a trivial task. That is, what has been done with internal state shifting in a serial input register now needs to be performed in one step parallely in FIG. 1c. Conventional design tools perform—for a given polynomial and length of the CRC—a simulation of a serial CRC circuit to find out how the individual entries in the serial shift registers change successively with the input of the T bits. On the basis of these simulations the coupling means is determined.

The inventor has performed simulations for designing (i.e. developing and generating) the parallel CRC circuit in such a way and discovered the problem, that the conventional coupling means CM has the disadvantage, that in fact too many feedbacks from the output registers are used. That is, since the conventional simulation tools look at each flip-flop (shift register) of the serial CRC circuit individually, it was discovered that they cannot detect that a possible redundancy exists, i.e. that too many feedbacks from the output registers or too many output lines of the input shift registers I are input to the XOR gates. This redundancy was found to increase the processing time and the hardware amount necessary in the parallel CRC generation circuit. Thus, depending on the used polynomial some of the feedbacks of signals are actually superfluous and the design tools so far have not recognized them as being unnecessary.

SUMMARY OF THE INVENTION

The invention is based on the realization of the problem that—depending on the used polynomial—not all feedbacks and not all outputs from the input registers are necessary as inputs for the XOR gates—and that it is sufficient for the parallel calculation of the CRC to consider only some of the previous values stored in the output registers.

Thus, the unknown problem perceived by the inventor is
to provide a method and a parallel CRC generation circuit which result in a higher processing speed whilst decreasing the hardware amount necessary for the realization of the parallel CRC generation circuit.

This problem is solved by a method according to claim 1 and a parallel CRC generation circuit according to claim 2.

According to the invention, a two dimensional (time-space) matrix representation of how all entries of a serial shift register for a given CRC polynomial change is stored in a memory. In this matrix representation indications are stored which essentially represent the internal states and the change of internal states indicated by the selected polynomial. This can be seen to be equivalent to the change of internal states (values stored in the shift registers) of a corresponding serial CRC generation circuit.

A special search technique is used to evaluate this matrix representation in order to cancel internal state transitions that occur twice for the same bit. That is, the search method evaluates the matrix represenation in such a way that internal states or input bits which would be input simultaneously to an XOR gate in the parallel circuit are cancelled, since an XOR combination of two identical states (input register output line or output register output line) does not lead to a change of an output signal of the respective XOR gate. Based on this realization, feedbacks from the output registers and/or input bits that do not lead to a change in the output signal are cancelled. Since the number of feedbacks from the output registers and the number of inputs from the input registers is reduced the processing time is decreased and the hardware amount necessary for the parallel CRC circuit is decreased.

Conventional design tools which only evaluate the internal states of each serial shift register in a serial CRC circuit cannot realize this double inputting of values to an XOR gate since they only evaluate individually the states in each serial shift register. Therefore, the invention provides a significant advantage in processing time and hardware amount reduction.

The method for generating a parallel CRC generation circuit automatically provides a parallel CRC circuit for any desired CRC code (predetermined CRC polynomial).

Furthermore, according to a further embodiment of the invention, the method automatically produces a VHDL code needed for manufacturing ASICs or FPGAs. A code output by the method will then be used for loading the respective FPGA. The ASICs and the FPGAs thus obtained have a much increased processing speed and a reduced hardware amount.

The invention can be used in any communication or transmission system where a CRC code is transmitted which must be generated at high speed.

Further advantageous embodiments and improvements of the invention are listed in the dependent claims. Hereinafter, the invention will be described with reference to its embodiments and examples as illustrated in the attached drawings. In the drawings, the same or similar reference numerals denote the same or similar parts.

DESCRIPTION OF THE INVENTION

The parallel CRC generation circuit according to the invention has the general configuration as shown in FIG. 1c. The parallel generation circuit generates a CRC code of length N as defined by the respective CRC polynomial according to the above stated equation (1a).

That is, generally the parallel CRC generation circuit according to the invention comprises an input register means I having T input registers $I_0, I_1, \ldots I_t, \ldots, I_{T-1}$ for simultaneously storing said T input bits, each input register having a respective output line $I(0), I(1), \ldots I(t) \ldots, I(T-1)$.

An output register means C has N output registers $C_0$, $C_1, \ldots C_n \ldots, C_{N-1}$ for simultaneously (parallely) storing said CRC code, said output registers C each having an input line $C_0(T), C_1(T), \ldots C_n(T) \ldots C_{N-1}(T)$ and an output line $C_0(\mathbf{0}), C_1(\mathbf{0}), \ldots C_n(\mathbf{0}) \ldots C_{N-1}(\mathbf{0})$.

A number N of XOR gates $XOR_0, XOR_1, XOR_n \ldots XOR_{N-1}$ are provided each having an output connected to a respective input line of said output registers and input lines being coupled with a predetermined number of said input register output lines and a predetermined number of said output register output lines.

The coupling means CM determines which of the output lines from the input registers I and which of the output lines from the output registers C are inputs to the individual XOR gates.

Figure 4:
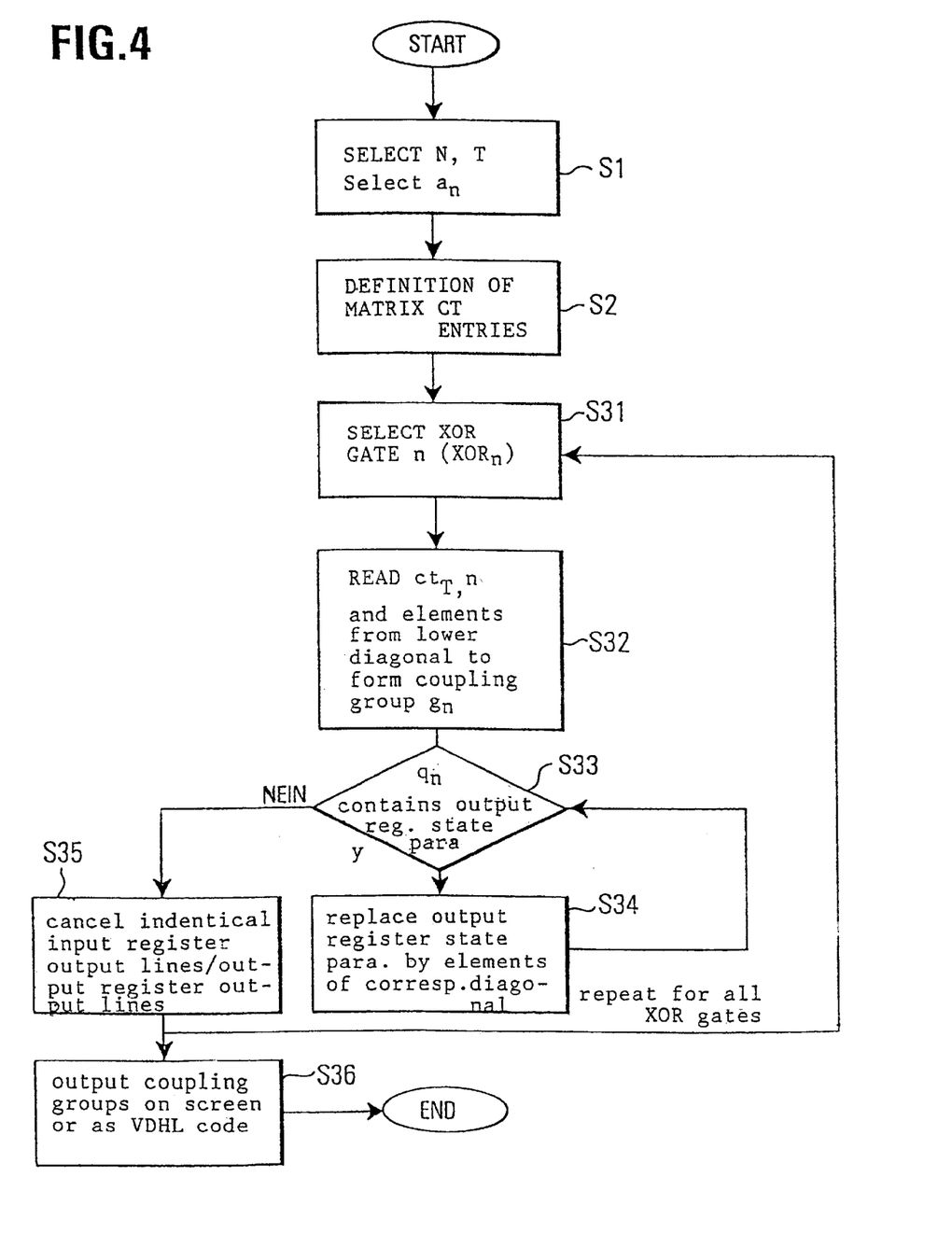
FIG. 4 shows a principle flow chart of the method according to the invention.

The method of the invention comprises the following steps as shown in FIG. 4. In step S1, on the basis of the general equation (1a) for the CRC polynomial, the length N of the desired CRC code and the type of the CRC code is selected by choosing a value for N and by defining which of the coefficients $a_n$, n=0 ..., N−1 are 0 or 1. Furthermore, in step S1 the length of the data packet T, i.e. the number of bits to be processed parallely, is determined. Thus, the number of input register output lines and the number of output register output lines has been determined for the circuit.

Figure 2A:
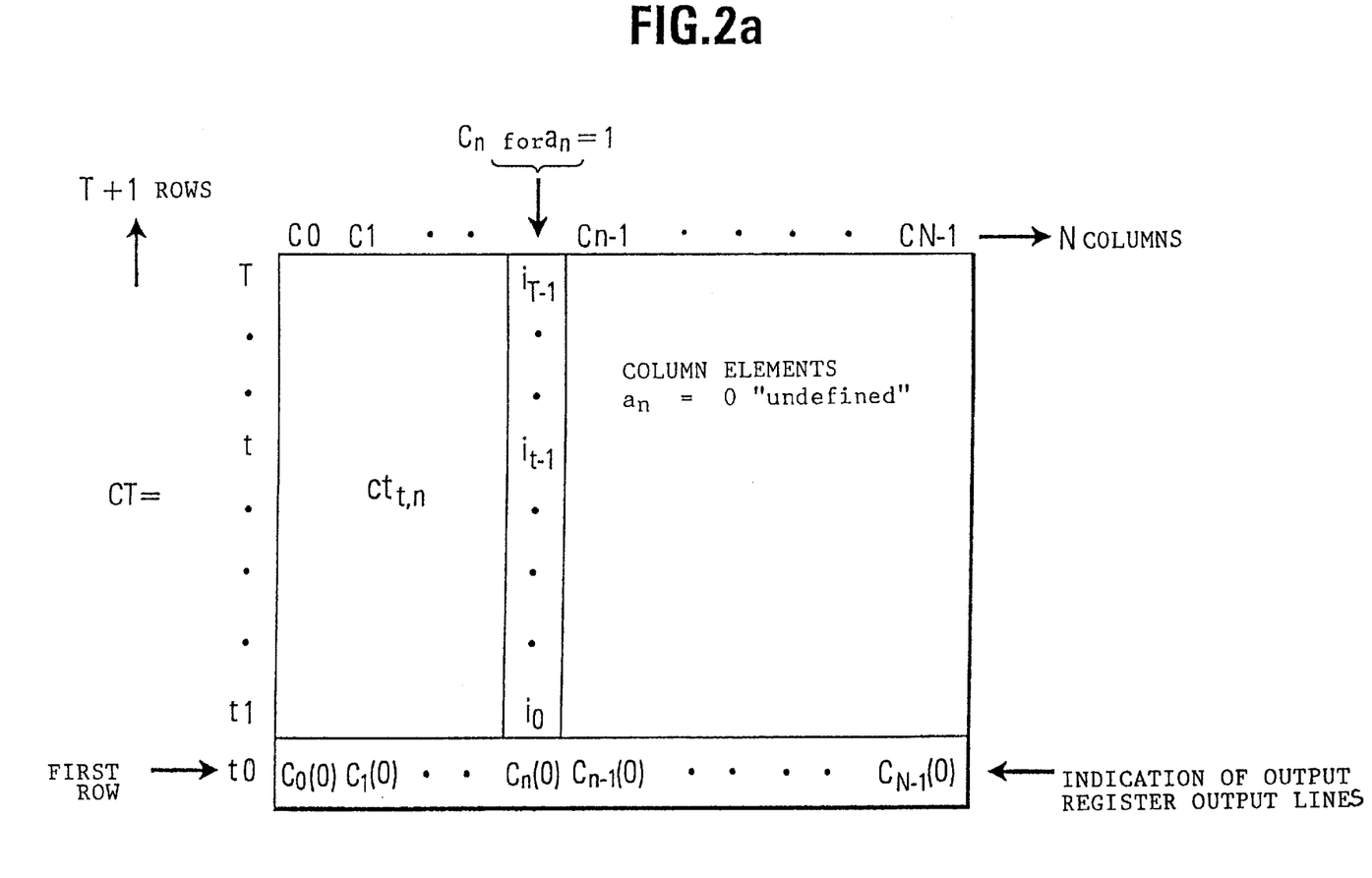
FIG. 2a shows the arrangement of a matrix CT with N columns and T+1 rows and matrix elements ct used by the method according to the invention.

On the basis of the selected values N, T and $a_n$ the matrix CT as shown in FIG. 2a is stored in a memory in step S2. The matrix CT has N columns numbered $C\mathbf{0}, C\mathbf{1}, \ldots cn \ldots CN-1$ and T+1 rows numbered $t\mathbf{0}, t\mathbf{1}, \ldots t \ldots T$.

Row elements $ct_{0,0}, ct_{0,1}, \ldots ct_{0,n} \ldots Ct_{0,N-1}$ in the first row $t\mathbf{0}$ store the number (i.e. an indication parameter) of the output register output lines $C_0(\mathbf{0}), C_1(\mathbf{0}), \ldots C_n(\mathbf{0}) \ldots C_{N-1}(\mathbf{0})$, respectively.

The column elements ct for columns Cn for which $a_n=0$ (e.g if $a_3=0$ then the column elements of column C3 are concerned) store a value $\mathbf{0}$ (i.e. they are "undefined" and assume the state of next lower element to the left in the diagonal in a next clock cycle when the matrix is viewed as the time-space representation of state changes as required by the CRC polynomial, e.g. in a serial CRC generation circuit) and column numbers Cn for which $a_n=1$ (e.g if $a_4=1$ then the column elements of column C4 are concerned) store the following value pair according to equation (2):

$$ct_{T,n} = i_{T-1} = (I(T-1), C_{N-1}(T-1)) \qquad (2)$$
$$ct_{T-1,n} = i_{T-2} = (I(T-2), C_{N-1}(T-2))$$
$$\vdots$$
$$ct_{t,n} = i_{t-1} = (I(t-1), C_{N-1}(t-1))$$
$$\vdots$$
$$ct_{1,n} = i_0 = (I(0), C_{N-1}(0))$$
$$\vdots$$

The first value in said pair denotes an input register output line, said second value in said pair denotes an output register state parameter and the value $C_{N-1}(\mathbf{0})$ denotes the output of the output register $C_{N-1}$.

There are three possible inputs for each element $ct_{t,n}$:

1) The lower left element $ct_{t-1}$, n−1, indicated by a diagonal arrow, which is used in every case where a lower left element exists (so always except for the left most column and the bottom row);

2) An existing output $C_n(\mathbf{0})$ of the output register, which is used in the bottom row only;

3) A feedback line (this is a XOR-combination of the output I (t−1) of the input register $I_{t-1}$ and the output register $C_{N-1}(t-1)$, indicated by $i_{t-1}$, which is used if the coefficient $a_n=1$ in the CRC polynominal and if the feedback line $i_{t-1}$ exists (so not in the lowest row).

Figure 2B:
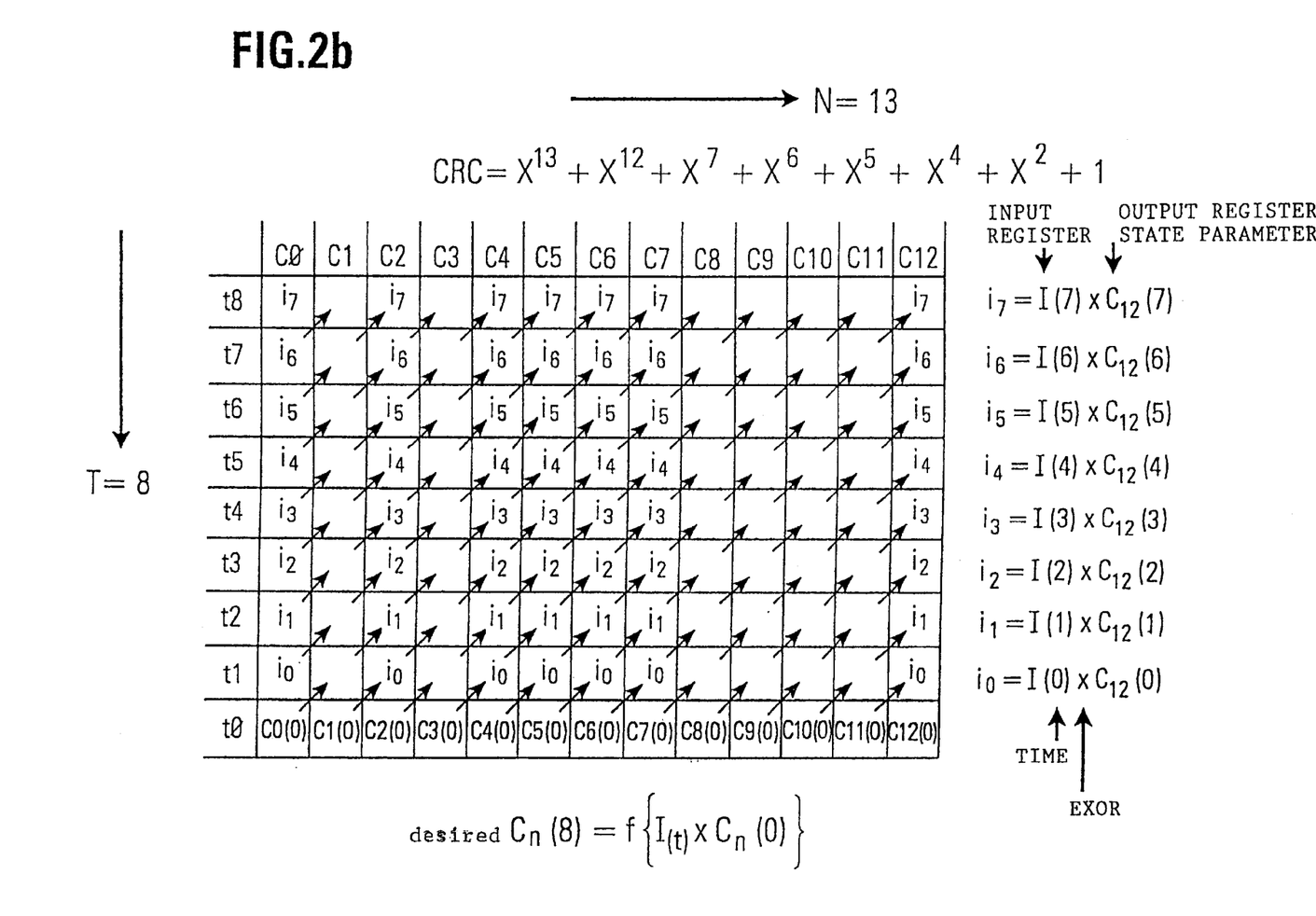
FIG. 2b shows the matrix CT for obtaining a parallel CRC circuit with reduced redundancy for the case of the polynomial used for the serial CRC generation circuit in FIG. 1b.

So the matrix is filled up (see the example in FIG. 2b).

In step S31 an XOR gate of number n (n is between 0 and N−1 as can be seen from FIG. 1c) is selected, that is, the matrix CT is evaluated to determine which output register output lines and input register output lines are to be input to the XOR gate $XOR_n$.

In step S32 the element $ct_{T,n}$ (this is the element in the top row T and the column n) of the matrix CT is selected. Then the coupling group gn will be built by following the diagonal direction left down until the lowest row or left most column and collecting all elements on that line (i.e. $i_{T-1}, i_t \ldots C_n(\mathbf{0})$). All $i_t$ will be replaced by I(t) XOR $C_{N-1}(t)$ such that $C_{N-1}(t)$ is the same as $ct_{t,N-1}$.

Then in step S33 it is investigated whether the coupling group $g_n$ contains only indications for input register output lines I(t) and output register output lines or "initial states" $C_n(\mathbf{0})$ (i.e. at this point it is clear how the inputs of XOR gate $XOR_n$ are formed) or also output register state paramters $ct_{t,n}$ (i.e. states that would occur in a serial CRC generation circuit but at a different clock cycle, namely not at the clock cycle $\mathbf{0}$). If in step S33 the coupling group $g_n$ is found to comprise output register state parameters $ct_{t,n}$ with t≠0 then these must be replaced because in the coupling group they do not represent either an input register output line or an output register output line. This replacement is carried out in step S34.

In step S34 elements $ct_{t,n}$ with t≠0 (n is always N−1 here) corresponding to said found output register state parameters and all elements arranged in a diagonal direction therefrom for decreasing row and column numbers are read and the output register state parameters in the coupling group are replaced with these values. In this context "corresponding" means, that when e.g the element contains the output register state parameter $C_{N-1}(T-1)$ then the element at column position N−1 and row position T−1 and all the elements on the lower left diagonal therefrom are read out and replace as a new series of value pairs the respective output line state parameter in the coupling group $g_n$.

Then said replacement step S34 and said checking step S33 is repeated until no further output register state paramters exist in said coupling goup $g_n$. Then, the coupling group only contains indications of input register output lines I(t) and output register output lines $C_n(\mathbf{0})$.

In a step S35 pairs of identical input register output line numbers and identical output register output line numbers in said coupling group $g_n$ are cancelled. This step can also be carried out at intermediate stages of the replacement since identical values might already be contained in the coupling group at intermediate stages.

Steps S31–S35 are repeated for all N XOR gates to form N coupling groups $g_n$. In step S36, the coupling groups $g_n$ can be ouptut on a screen or as an actual VHDL code used for ACISs and FPGAs (ASIC: Application Specific Integrated Circuit; FPGA: Field Programmble Gate Array) by an automatic design and manufacturing device.

Thus, due to the replacement and cancelling steps in connection with the specially set matrix in the memory, each obtained coupling group $g_n$ for each XOR indicates the input register output lines and the output register output lines to be connected to the input of the respective XOR gate.

As can be seen from FIG. 2a, basically the matrix CT is an actual representation of how the entries in shift registers of a serial CRC generation circuit (serially realizing the selected CRC polynomial) would change from clock cycle to clock cycle. According to the invention this kind of (time-space) representation of the sequential state changes, when evaluated by the method of the invention, allows to detect all redundancies where the same bit—when being feed back from the output—would be input to the same XOR gate again. The evaluation of the matrix CT in FIG. 2a thus allows to detect all the redundancies which should be avoided in the parallel CRC circuit. Consequently a circuit realized on the basis of the so obtained coupling groups $g_n$ has an increased processing speed and only needs a minimum amount of hardware.

The method described above with reference to FIG. 4 is general and no redundancy can be missed. The method is general in that it allows to design the superior parallel CRC generation circuit for any selected values of N, $a_n$ and T.

The above described method can be used together with a design tool outputting the VHDL code to manufacture an ASIC or to program a FPGA device. That is, a design tool for automatically making the CRC circuit can produce the optimal CRC circuit merely on the basis of the input parameters N, $a_n$ and T input by the user and the coupling groups obtained and automatically produces the real device, for example by outputting the VHDL code which reflects the interconnections of all input and output lines in the parallel CRC circuit.

EXAMPLE

To illustrate the method of the invention hereinafter the making of a parallel CRC generation circuit without redundancy corresponding to the serial CRC generation circuit and polynomial in FIG. 1b will be described below.

Figure 3:
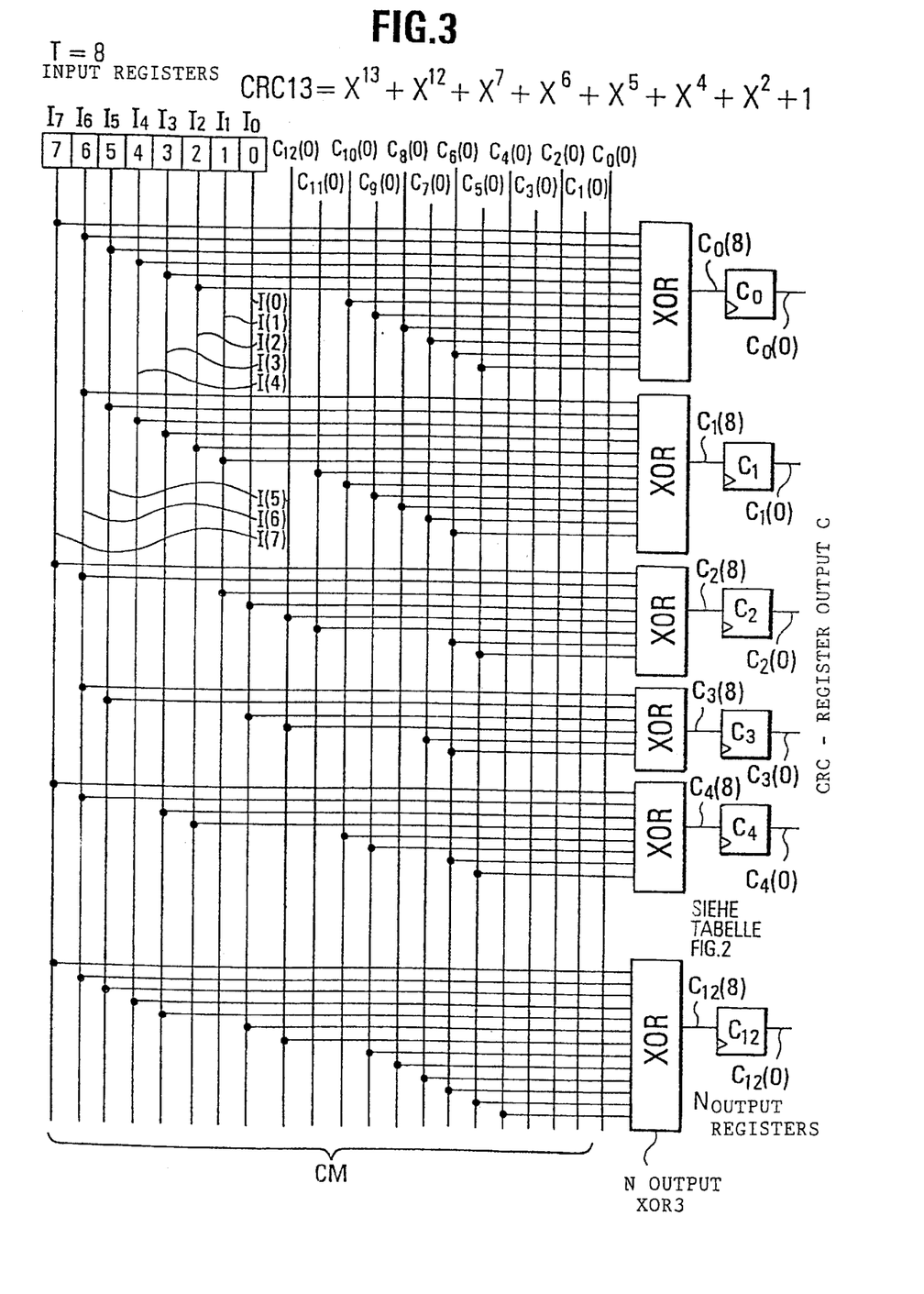
FIG. 3 shows the parallel CRC generation circuit for the example in FIG. 1b according to the invention by using the table in FIG. 2c.

FIG. 2b shows the coupling matrix CT for the case illustrated in FIG. 1b. FIG. 3 shows the corresponding parallel CRC generation circuit after applying the method of the invention to the matrix CT shown in FIG. 2b.

For the polynomial CRCN as defined with equation (1a) a value of N=13 and $a_{13}=a_{12}=a_7=a_6=a_5=a_4=a_2=a_0=1$ has been selected. The number of bits T to be processed parallely has been selected to be T=8. As indicated in FIG. 3, such a selection results in the arrangement of an input register means I having 8 input registers $I_0$–$I_7$ for simultaneously storing a data packet of T=8 input bits. The output lines of the input registers I0–I7 are denoted I(0)–I(7) as FIG. 3 shows. In accordance therewith the matrix CT in FIG. 2b has T+1=9 rows denoted t0–t8.

Since N=13 the output register means C has 13 output registers $C_0$–$C_{12}$ for simultaneously storing the CRC13 code. The output registers have respective input lines $C_0(8)$–$C_{12}(8)$ and respective output lines $C_0(0)$–$C_{12}(0)$. Thus, the matrix CT in FIG. 2b comprises 13 columns denoted C0–C12.

N=13 XOR gates $XOR_0$–$XOR_{12}$ are arranged each having a respective output connected to a respective input line of the output register and a number of input lines being coupled with a predetermined number of said input register output lines and a predetermined number of said output register output lines.

The row elements in the bottom row t0 of matrix CT respectively store an indication parameter of the respective output register output lines $C_0(0)$–$C_{12}(0)$.

Since for the selected CRC13 code $a_1=a_3=a_8=a_9=a_{10}=a_{11}=0$ the column elements in columns C1, C3, C8, C9, C10, C11, do contain only the diagonal entry as parameter. On the other hand the columns for C0, C2, C4, C5, C6, C7, C12 respectively contain a value pair since for these columns $a_n=1$. In FIG. 2b the abbreviation $i_0$–$i_7$ is used, however, in fact each of these column elements store a value as is illustrated with the table on the right side of the matrix in FIG. 2b. The "x" in this Table indicates that these two values belong together in one coupling group (in fact, looking at the corresponding serial configuration in FIG. 1b, the value pairs $i_0$–$i_7$ correspond to the XOR combination of a respectively serially input bit. from the respective input register $I_0$–$I_7$ and the output from the last serial shift register C12 at different clock cycles 0–7). The output register state parameters defined are the values $C_{12}(7)$, $C_{12}(6)$, $C_{12}(5)$, $C_{12}(4)$, $C_{12}(3)$, $C_{12}(2)$ and $C_{12}(1)$, whereas $C_{12}(0)$ indicates a real output register line number of the output register C12.

All columns n=0, n=2, n=4, n=5, n=6, n=7, n=12 (i.e. C0, C2, C4, C5, C6, C7, C12) contain the same elements and as an example the elements of the first column (column number C0) are listed below:

$$ct_{8,0} = i_7 = (I(7), C_{12}(7))$$

$$ct_{7,0} = i_6 = (I(6), C_{12}(6))$$

$$ct_{6,0} = i_5 = (I(5), C_{12}(5))$$

$$ct_{5,0} = i_4 = (I(4), C_{12}(4))$$

$$ct_{4,0} = i_3 = (I(3), C_{12}(3))$$

$$ct_{3,0} = i_2 = (I(2), C_{12}(2))$$

$$ct_{2,0} = i_1 = (I(1), C_{12}(1))$$

$$ct_{1,0} = i_0 = (I(0), C_{12}(0))$$

$$ct_{0,0} = C_{12}(0)$$

The other columns that contain defined values for $a_n=1$ contain the same values. In the used notation, the first value in the pair denotes an input register output line, the second value in the pair denotes an output register state parameter and the value $C_{12}(0)$ denotes the output register output line $C_{12}$ of the output register number 12 as is shown in FIG. 3. $C_{12}(0)$ may also be regarded as the output register state parameter of the output register $C_{12}$ at an initial state.

Having arranged the matrix CT as in FIG. 2b, for illustration purposes the arrows indicate how the states would change in a serial CRC generation circuit with each clock cycle. Therefore, as stated before, the matrix CT in FIG. 2b is an actual time-space representation of the state change in the serial CRC generation circuit on the basis of the selected polynomial, except that in FIG. 3 (and FIG. 2a) the representation is made simultaneously for all state changes and illustrates the sequential shifting of the bits from shift register to shift register including the respective XOR connections as shown in FIG. 1b. It should be noted that the coupling matrix in FIG. 2b can fully be set with the respective elements once the values of N, T and $a_n$ have been selected.

Hereinafter, an example will be discussed how the final coupling group $g_4$ for the output register $C_4$ is formed using the method of the invention in a matrix as set in FIG. 2b.

The XOR gate of number n=4, i.e. the element $ct_{t8,c,4}$ or the element of the crossing point of row number t8 and column number C4, is selected. Thus the element $$ct_{8,4}=i_7=(I(7),C_{12}(7))$$

is read out. Then all elements on the diagonal to the bottom left side from the element $ct_{8,4}$ which have been defined are read out and are input into the coupling group $g_4$. In this case the elements $i_5$, $i_3$ are read out. The coupling group thus formed contains:

$$g_4 = i_7; i_5; i_3 \qquad (3.1)$$
$$= I(7), \mathbf{C_{12}(7)}; I(5), \mathbf{C_{12}(5)}; I(3), \mathbf{C_{12}(3)}.$$

So far the coupling group $g_4$ does contain indications of output lines I(7), I(5), I(3) of the input registers $I_7$, $I_5$, $I_3$. However, it does not contain indications of output lines from the output registers, i.e. it only contains output register state parameters $C_{12}(7)$, $C_{12}(5)$, $C_{12}(3)$ (shown in bold-face letters). Therefore, these output register state parameters must be used for a further decomposition or replacement.

The element $ct_{7,12}$ corresponding to the output register state paramter $C_{12}(7)$ is used as the next starting element and the reading out of the (defined) elements on the diagonal therefrom is performed. The output register state parameter $C_{12}(7)$ is then replaced by the elements of this readout diagonal. The same procedure is repeated using the elements $ct_{5,12}$ for replacing the output register state parameter $C_{12}(5)$ and the element $ct_{3,12}$ for replacing the output register state parameter $C_{12}(3)$. Thus, the coupling group $g_4$ now contains:

$$g_4 = I(7), \mathbf{C_{12}(7)} = I(7), i6; i1; i0; C_5(0); \qquad (3.2)$$
$$I(5), \mathbf{C_{12}(5)} = I(5), i4; C_7(0);$$
$$I(3), \mathbf{C_{12}(3)} = I(3), i2; C_9(0).$$

The i's were only used for abbreviation, such that the complete coupling group is defined as:

$$g_4 = I(7); I(6), C_{12}(6); I(1), C_{12}(1); \qquad (3.3)$$
$$I(0), C_{12}(0); C_5(0));$$
$$I(5); I(4), C_{12}(4); C_7(0);$$
$$I(3); I(2); C_{12}(2); C_9(0);$$

Now the coupling group $g_4$ contains some input register output lines, output register state parameters (printed in boldface) and for the first time output register output lines C5(0), C7(0), C9(0) which have been read from the bottom row of the matrix CT. Again, the procedure of replacing the output register state parameters by respective elements in the 13th column (and the diagonal elements to the left lower diagonal) is repeated until all output register state parameters have been replaced, i.e. until the coupling group $g_4$ only contains indications of the input register output lines and the output register output lines as follows:

$$g_4 = I(7); I(6)Ii5, i0, C_6(0); I(1); i0, C_{11}(0); I(0), C_{12}(0); C_5(0));$$
$$I(5), I(4), i3, C_8(0); C_7(0); I(3), I(2), i1, C_{10}(0); C_9(0). \qquad (3.4)$$

--->

$$g_4 = I(7), I(6), I(5), C_{12}(5), I(0), C_{12}(0), C_6(0);$$
$$I(1), I(0), C_{12}(0), C_{11}(0); I(0), C_{12}(0);$$
$$C_5(0);$$
$$I(5), I(4), I(3), C_{12}(3), C_8(0); C_7(0);$$
$$I(3), I(2), I(1), C_{12}(1), C_{10}(0); C_9(0). \qquad (3.5)$$

Further replacements lead to:

$$g_4 = I(7), I(6), I(5), I(4), I(3), I(2), I(1), I(0),$$

$$C_{12}(0), C_{11}(0), C_{10}(0), C_9(0), C_8(0), C_7(0),$$

$$I(0), C_{12}(0), C_6(0); I(1), I(0), C_{12}(0), C_{11}(0);$$

$$I(0), C_{12}(0); C_5(0));$$

$$I(5), I(4), I(3), I(2), I(1), I(0), C_{12}(0),$$

$$C_{11}(0), C_{10}(0), C_9(0), C_8(0); C_7(0);$$

$$I(3), I(2), I(1), I(0), C_{12}(0), C_{11}(0), C_{10}(0);$$

$$C_9(0). \qquad (3.6)$$

Since now the coupling group only contains output register output lines and input register output lines, the essential step of the invention can be carried out, namely the cancellation of identical input register output lines and identical output register output lines. Therefore, the elements $$I(5), I(4), I(3), I(2), I(1), I(0), C_{12}(0), C_{11}(0),$$

$$C_{10}(0), C_9(0), C_8(0), C_7(0), I(0), C_{12}(0), I(1), I(0),$$

$$C_{12}(0), C_{11}(0); I(0), C_{12}(0); I(5), I(4), I(4), I(3), I(2),$$

$$I(1), I(0), C_{12}(0), C_{11}(0) C_{10}(0), C_9(0), C_8(0);$$

$$C_7(0); I(1), I(0), C_{12}(0), C_{11}(0). \qquad 3.7$$

are cancelled which leaves the final coupling group $g_4$ having no redundancy as follows:

$$g_4 = I(7), I(6), C_6(0); C_5(0); I(3), I(2),$$

$$C_{10}(0); C_9(0) \qquad (3.8)$$

Thus, the finally obtained coupling group $g_4$ contains no redundancies and indicates the number of input register output lines and output register output lines which need to be input to the selected XOR gate of number 4.

Of course it should be noted that it is not absolutely necessary to always split up the groupings until they contain only output lines of the input and output registers before performing the cancellations. For example, in equation (3.4) it could have been already observed that i0 is contained twice in the coupling group. Therefore it could have been cancelled already here, since even if this element occurs again later on, it can be left in the coupling group or be used again. Therefore, the algorithm could also at intermediate steps scan the coupling group and perform cancellations. For example, replacing the first element i7 in equation (3.1) three times already leads to $$i7 = I(7), C_{12}(7) \to I(7), i6, i1, i0, C_5(0) \to I$$

$$(7), I(6),$$

$$C_{12}(6), i1, i0, C_5(0) \to I(7), I(6), i5, i0, C_6(0),$$

$$i1, i0,$$

$$C_5(0), \qquad (3.9)$$

where i5 already occurs a further time so that it can be cancelled with the is in equation (3.1) as the second element. Furthermore the decomposition in equation (3.9) already in itself contains i0 twice so that also this i0 can be cancelled here. The result of either performing intermediate cancellations or to perfrom the cancellation only at the end differ in the processing time for obtaining the final result, since of course values which are cancelled earlier in the procedure do not need to be decomposed again. However, the above example shows that the step S35 in FIG. 4 needs not necessarily to be performed at the end of all decompositions, but can also be performed several times at intermediate stages of the decomposition procedure.

Figure 2C:
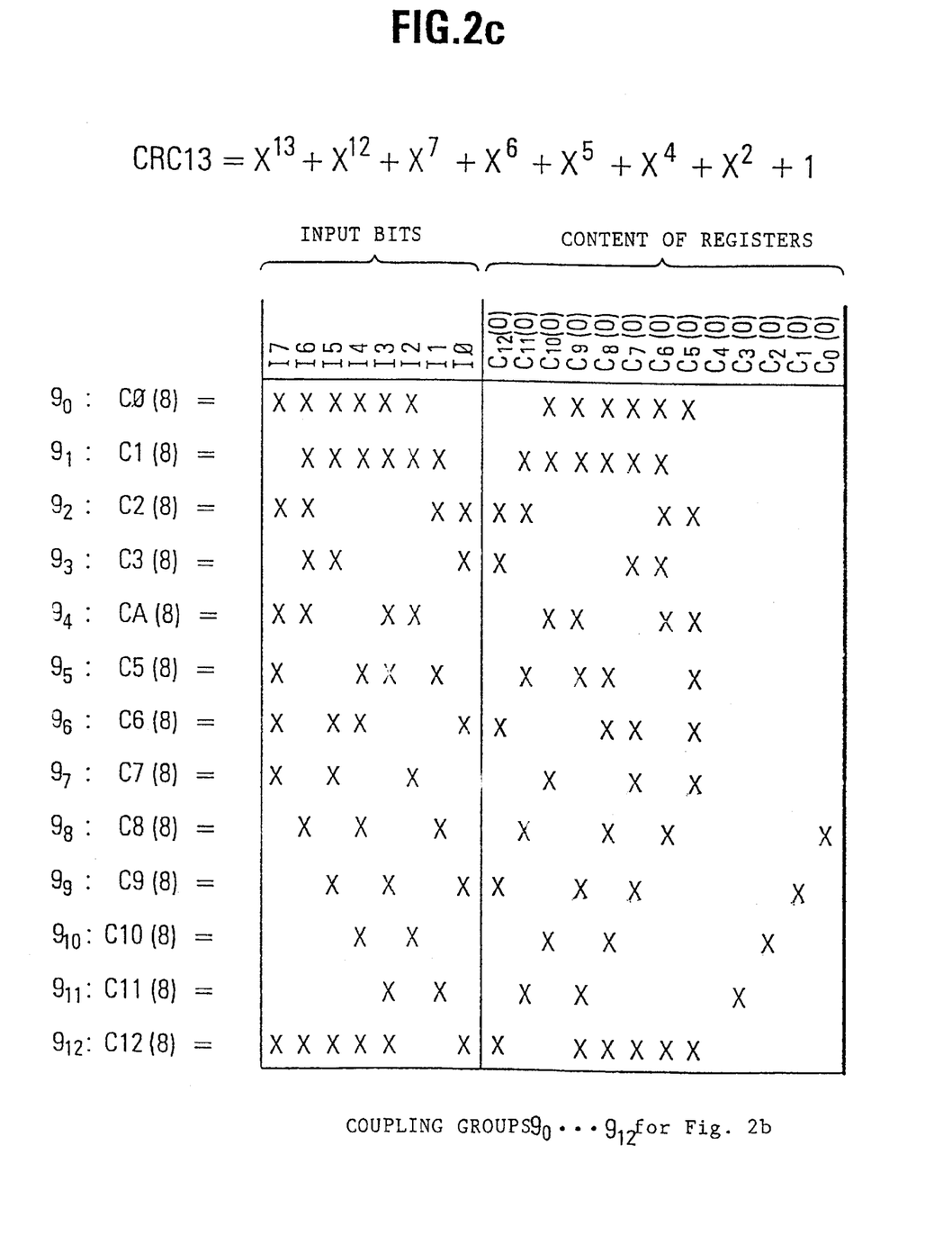
FIG. 2c shows a table illustrating which output of the input registers I and which output of the output registers C are used as input for each XOR-Gate (so the table corresponds to the coupling means CM in FIG. 1c) by using the polynomial of FIG. 2b, said table being the result of FIG. 2b.

The same procedure is repeated for all remaining 12 XOR gates and a respective coupling group $g_n$ with no redundancy is formed. FIG. 2c shows the overview of the respective coupling groups $g_0 \ldots g_{12}$ which are then used for connecting the output lines to the respective XOR.

FIG. 3 shows the final circuit for the selected values of T=8, N=13 and the respective values $a_n$. The surprising result of using the matrix in FIG. 2b is that some of the values can be recognized as compensating each other and that the XOR outputs can respectively only be calculated as a function of the input register output lines and the respective output register output lines.

Only the usage of the grouping of the elements by reading out the respective elements ct according to the method of the invention allows to cancel the dependencies (redundancies) of the feedback of output lines and input lines. The method can be fully automated and a respective code can be output by a respective processing means in order to load a FPGA or develop an ASIC. The method is general and only the values T, N and the $a_{n's}$ need to be selected.

It may be noted that of course the rows and columns may be exchanged without any loss of generality.

INDUSTRIAL APPLICABILITY

The parallel CRC calculation circuit designed according to the method of the invention can be used in any transmitter or receiver of a transmission system where the calculation and transmission of CRC is performed in order to check errors on the user data.

It should be noted that the invention is not restricted to the above described embodiment and that variations and modifications of the invention may be performed by persons skilled in the art on the basis of the above teachings. In particular, it should be noted that the invention can comprise features from individual claims as listed below. Reference numerals in the claims only serve clarification purposes and do not limit the scope of protection.

What is claimed is:

1. A method for generating a parallel CRC generation circuit for parallely generating a CRC code of length N defined as a CRC polynomial (CRC)

$$CRC = a_N x^N + a_{N-1} x^{N-1} + \ldots a_n x^n + \ldots a_1 x^1 + a_0 x^0$$

where $a_N = a_0 = 1$ and the coefficients $a_n$ are 0, 1 depending on the CRC code to be formed, parallely for a number T of input bits of a data stream, comprising the following steps:

d) determining coupling groups in defining a coupling of input register output lines of an input register means (I) having T input registers $I_0, I_1, \ldots I_t, \ldots, I_{T-1}$ for simultaneously storing said T input bits, each input register having an output line $I(0), I(1), \ldots I(t) \ldots, I(T-1)$, and output register output lines of an output register means (C) having N output registers $C_0, C_1, \ldots C_n \ldots, C_{N-1}$ for simultaneously storing said CRC code, with input lines of a number N of XOR gates $XOR_0, XOR_1, \ldots XOR_n \ldots XOR_{N-1}$ each having an output connected to a respective input line of said output registers and input lines being coupled with a predetermined number of said input register output lines and a predetermined number of said output register output lines;

wherein said step of determining comprises the following steps:

e1) storing in a memory a matrix CT with N columns and T+1 rows:

wherein the row elements $ct_{0,0}, ct_{0,1}, \ldots ct_{0,n} \ldots ct_{0,N-1}$ in row 0 respectively store the index of the output register output lines $C_0(0), C_1(0), \ldots C_n(0) \ldots C_{N-1}(0)$; and wherein the column elements for columns numbers n for which $a_n = 0$ store an arbitrary non-read value indicating that this value is not to be considered for forming of coupling groups and column numbers n for which $a_n = 1$ store the following value pair:

$$ct_{T,n} = i_{T-1} = (I(T-1), C_{N-1}(T-1)) \quad (2)$$

$$ct_{T-1,n} = i_{T-2} = (I(T-2), C_{N-1}(T-2))$$

$$\vdots$$

$$ct_{t,n} = i_{t-1} = (I(t-1), C_{N-1}(t-1))$$

$$\vdots$$

$$ct_{1,n} = i_0 = (I(0), C_{N-1}(0))$$

where the first value in said pair denotes an input register output line, said second value in said pair denotes an output register state parameter and the value $C_{N-1}(0)$ denotes the output line of the output register output line $C_{N-1}$;

e2) determining the index of input register output lines and the index of output register output lines for each of said N XOR gates $XOR_0, XOR_1, \ldots XOR_n, \ldots XOR_{N-1}$ as follows:

e21) selecting a number n[0, N−1] of an XOR gate;

e22) reading the element pair $ct_{T,n}$ from the matrix CT and all element pairs arranged in a diagonal direction therefrom for decreasing row and column numbers and grouping them in a coupling group $g_n$;

e23) if the coupling group $g_n$ comprises output register state parameters $C_{N-1}(t)$ With $t \neq 0$, reading element pairs $Ct_{t,N-1}$ with $t \neq 0$ corresponding to said output register state parameters and all elements pairs arranged in a diagonal direction therefrom for decreasing row and column numbers and replacing the output register state parameters in the coupling group with these values;

e24) repeating said reading out step e23 until no further output register state parameters exist in said coupling group $g_n$ and cancelling pairs of identical input register output line indexes and identical output register output line indexes in said coupling group either at intermediate stages of the replacement or after all output register state parameters have been replaced; and e25) repeating steps e21–e24 for all N XOR gates to form N coupling groups;

e26) wherein each coupling group $g_n$ for each XOR gate indicates the indices of the input register output lines and the output register output lines to be connected to the input of the respective XOR gate.

2. A set of computer-readable instructions stored on a computer-readable storage medium for parallely generating a CRC code of length N defined as a CRC polynomial (CRC)

$$CRC=a_N x^N + a_{N-1} x^{N-1} + \ldots a_n x^n + \ldots a_1 x^1 + a_0 x^0$$

where $a_N = a_0 = 1$ and the coefficients $a_n$ are 0, 1 depending on the CRC code to be formed, parallely for a number T of input bits of a data stream, comprising the following steps:
  d) determining coupling groups in defining a coupling of input register output lines of an input register means (I) having T input registers $I_0, I_1, \ldots I_t, \ldots, I_{T-1}$ for simultaneously storing said T input bits, each input register having an output line $I(0), I(1), \ldots I(t) \ldots, I(T-1)$, and
  output register output lines of an output register means (C) having N output registers $C_0, C_1, \ldots C_n \ldots, C_{N-1}$ for simultaneously storing said CRC code, with input lines of a number N of XOR gates $XOR_0, XOR_1, \ldots XOR_n \ldots XOR_{N-1}$ each having an output connected to a respective input line of said output registers and input lines being coupled with a predetermined number of said input register output lines and a predetermined number of said output register output lines;
  wherein said step of determining comprises the following steps:
  e1) storing in a memory a matrix CT with N columns and T+1 rows:
    wherein the row elements $ct_{0,0}, ct_{0,1}, \ldots ct_{0,n} \ldots ct_{0,N-1}$ in row 0 resepctively store the index of the output register output lines $C_0(0), C_1(0), \ldots C_n(0) \ldots C_{N-1}(0)$; and wherein the column elements for columns numbers n for which $a_n = 0$ store an arbitrary non-read value indicating that this value is not to be considered for forming of coupling groups and column numbers n for which $a_n = 1$ store the following value pair:

$$ct_{T,n} = i_{T-1} = (I(T-1), C_{N-1}(T-1))$$
$$ct_{T-1,n} = i_{T-2} = (I(T-2), C_{N-1}(T-2))$$
$$\vdots$$
$$ct_{t,n} = i_{t-1} = (I(t-1), C_{N-1}(t-1))$$
$$\vdots$$
$$ct_{1,n} = i_0 = (I(0), C_{N-1}(0))$$

where the first value in said pair denotes an input register output line, said second value in said pair denotes an output register state parameter and the value $C_{N-1}(0)$ denotes the output line of the output register output line $C_{N-1}$;
  e2) determining the index of input register output lines and the index of output register output lines for each of said N XOR gates $XOR_0, XOR_1, \ldots XOR_n, \ldots XOR_{N-1}$ as follows:
    e21) selecting a number n $[0, N-1]$ of an XOR gate;
    e22) reading the element pair $ct_{T,n}$ from the matrix CT and all element pairs arranged in a diagonal direction therefrom for decreasing row and column numbers and grouping them in a coupling group $g_n$;
    e23) if the coupling group $g_n$ comprises output register state parameters $C_{N-1}(t)$ With $t \neq 0$, reading element pairs $ct_{t,N-1}$ with $t \neq 0$ corresponding to said output register state parameters and all elements pairs arranged in a diagonal direction therefrom for decreasing row and column numbers and replacing the output register state parameters in the coupling group with these values;
    e24) repeating said reading out step e23 until no further output register state parameters exist in said coupling group $g_n$ and cancelling pairs of identical input register output line indexes and identical output register output line indexes in said coupling group either at intermediate stages of the replacement or after all output register state parameters have been replaced; and
    e25) repeating steps e21–e24 for all N XOR gates to form N coupling groups;
    e26) wherein each coupling group $g_n$ for each XOR gate indicates the indices of the input register output lines and the output register output lines to be connected to the input of the respective XOR gate.

3. A parallel CRC generation circuit for parallely generating a CRC code of length N defined as a CRC polynomial (CRC)

$$CRC=a_N x^N + a_{N-1} x^{N-1} + \ldots a_n x^n + \ldots a_1^1 + a_0 x^0$$

where $a_N = a_0 = 1$ and the coefficients $a_n$ are 0, 1 depending on the CRC code to be formed, parallely for a number T of input bits of a data stream, comprising:
  a) an input register means (I) having T input registers $I_0, I_1, \ldots I_t, \ldots, I_{T-1}$ for simultaneously storing said T input bits, each input register having an output line $I(0), I(1), \ldots I(t) \ldots, I(T-1)$;
  b) an output register means (C) having N output registers $C_0, C_1, \ldots C_n \ldots, C_{N-1}$ for simultaneously storing said CRC code, said output registers each having an input line $C_0(T), C_1(T), \ldots C_n(T) \ldots C_{N-1}(T)$ and an output line $C_0(0), C_1(0), \ldots C_n(0) \ldots C_{N-1}(0)$;
  c) a number N of XOR gates $XOR_0, XOR_1, \ldots XOR_n \ldots XOR_{N-1}$ each having an output connected to a respective input line of said output registers and input lines being coupled with a predetermined number of said input register output lines and a predetermined number of said output register output lines;
  d) coupling means for determining coupling groups $g_n$ defining a coupling of
    said input register output lines of said input register means (I); and
    said output register output lines of said output register means (C), with
    said input lines of said number N of XOR gates $XOR_0, XOR_1, \ldots XOR_n \ldots XOR_{N-1}$;
    said coupling means comprising:
    e1) storing means adapted to store in a memory a matrix CT with N columns and T+1 rows:
      wherein the row elements $ct_{0,0}, ct_{0,1}, \ldots ct_{0,n} \ldots ct_{0,N-1}$ in row 0 respectively store the index of the output register output lines $C_0(0), C_1(0), \ldots C_n(0) \ldots C_{N-1}(0)$; and
      wherein the column elements for columns numbers n for which $a_n = 0$ store an arbitrary non-read value indicating that this value is not to be considered for forming of coupling groups and column numbers n for which $a_n = 1$ store the following value pair:

$$ct_{T,n} = i_{T-1} = (I(T-1), C_{N-1}(T-1))$$

$$ct_{T-1,n} = i_{T-2} = (I(T-2), C_{N-1}(T-2))$$

$$\vdots$$

$$ct_{t,n} = i_{t-1} = (I(t-1), C_{N-1}(t-1))$$

$$\vdots$$

$$ct_{1,n} = i_0 = (I(0), C_{N-1}(0))$$

where the first value in said pair denotes an input register output line, said second value in said pair denotes an output register state parameter and the value $C_{N-1}(\mathbf{0})$ denotes the output line of the output register output line $C_{N-1}$;

e2) determining means adapted to determine the index of input register output lines and the index of output register output lines for each of said N XOR gates $XOR_0$, $XOR_1$, ... $XOR_n$, ... $XOR_{N-1}$, said determining means a comprising:

e21) selection means adapted to select a number n [0, N−1] of an XOR gate;

e22) reading means adapted to perform a first read function to read the element pair $Ct_{T,n}$ from the matrix CT and all element pairs arranged in a diagonal direction therefrom for decreasing row and column numbers and grouping them in a coupling group $g_n$;

e23) said reading means being further adapted to perform a second read function, if the coupling group $g_n$ comprises output register state parameters $C_{N-1}(t)$ with t≠0, TO READ element pairs $ct_{t,N-1}$ with t≠0 corresponding to said output register state parameters and all elements pairs arranged in a diagonal direction therefrom for decreasing row and column numbers, said reading means comprising a replacement means for replacing the output register state parameters in the coupling group with these values;

e24) first repeating means for performing a first repeating function of said second read function until no further output register state parameters exist in said coupling group $g_n$ and said first repeating means further comprising a cancellation means for canceling pairs of identical input register output line indexes and identical output register output line indexes in said coupling group either at intermediate stages during the replacing of the output register state parameters or after all output register state parameters have been replaced; and e25) second repeat means for performing a second repeating function to trigger the selection means to repeat its selection function e21, the reading means to repeat its first and second read functions e22, e23, and the first repeat means to repeat its first repeat function e24 for all N XOR gates to form N coupling groups;

e26) an indication means for indicating, by each coupling group $g_n$ for each XOR gate, the indices of the input register output lines and the output register output lines to be connected to the input of the respective XOR gate.

\* \* \* \* \*